(12) United States Patent
Matsumoto et al.

(10) Patent No.: US 9,050,961 B2
(45) Date of Patent: Jun. 9, 2015

(54) BRAKE DRIVE AND CONTROL DEVICE FOR DETECTING SHORT CIRCUIT FAILURE OF SWITCHING ELEMENT

(71) Applicant: FANUC CORPORATION, Minamitsuru-gun, Yamanashi (JP)

(72) Inventors: Yasuyuki Matsumoto, Yamanashi (JP); Tsutomu Shikagawa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 48 days.

(21) Appl. No.: 14/019,050

(22) Filed: Sep. 5, 2013

(65) Prior Publication Data

US 2014/0060982 A1    Mar. 6, 2014

(30) Foreign Application Priority Data

Sep. 6, 2012  (JP) ................................. 2012-196451

(51) Int. Cl.
| | |
|---|---|
| *H02K 7/10* | (2006.01) |
| *B60T 17/22* | (2006.01) |
| *B60T 13/74* | (2006.01) |
| *B60T 8/88* | (2006.01) |
| *B60T 8/17* | (2006.01) |
| *F16D 121/26* | (2012.01) |
| *G01R 31/02* | (2006.01) |

(52) U.S. Cl.
CPC .............. *B60T 17/221* (2013.01); *B60T 13/74* (2013.01); *B60T 13/741* (2013.01); *B60T 8/885* (2013.01); *B60T 8/17* (2013.01); *F16D 2121/26* (2013.01); *B60T 2270/406* (2013.01); *G01R 31/025* (2013.01)

(58) Field of Classification Search
USPC ......... 318/568.21, 56, 57, 60, 86, 87, 400.09, 318/612, 614, 703, 741, 742, 757, 759, 258, 318/261, 362, 364, 371, 372, 374, 375, 318/376; 700/245, 165, 250, 258, 292; 303/20, 122.04, 122.05, 124, 152; 188/70 B, 72.1, 162, 362
See application file for complete search history.

(56) References Cited

U.S. PATENT DOCUMENTS 8,126,593 B2 *  2/2012  Watanabe et al. ............. 700/245

FOREIGN PATENT DOCUMENTS

| EP | 1974870 A1 | 10/2008 |
|---|---|---|
| JP | 6331679 A | 12/1994 |
| JP | 2009196031 A | 9/2009 |
| JP | 4734581 B2 | 7/2011 |

* cited by examiner

*Primary Examiner* — Antony M Paul
(74) *Attorney, Agent, or Firm* — Lowe Hauptman & Ham, LLP

(57) ABSTRACT

A first switching element is connected to one end of a brake and switches from the off state to the on state when a switch command is input to cause a brake drive current to flow through the brake. A second switching element is connected to the other end of the brake and switches from the off state to the on state when the switch command is input to cause a brake drive current to flow through the brake. A voltage detection unit detects a brake voltage being applied to the brake. A switch command delay unit delays the switch command input to the first switching element. A short circuit determination unit determines whether or not a short circuit has occurred in the first switching element based on the brake voltage and the switch command delayed by the switch command delay unit.

2 Claims, 3 Drawing Sheets

BRAKE DRIVE AND CONTROL DEVICE FOR DETECTING SHORT CIRCUIT FAILURE OF SWITCHING ELEMENT

RELATED APPLICATIONS

The present application is based on, and claims priority from, Japanese Application Number 2012-196451, filed Sep. 6, 2012, the disclosure of which is hereby incorporated by reference herein in its entirety.

BACKGROUND OF THE INVENTION

1. Field of the Invention

The present invention relates to a brake drive and control device for driving and controlling a brake in order to change the state of the brake from a disengaged state to an engaged state by stopping a brake drive current flowing through the brake that brakes a driven object driven in the gravity axis direction by a motor.

2. Description of Related Art

In an industrial robot, etc., having a gravity axis, a brake drive and control device for driving and controlling a brake that brakes the driven object is used in order to prevent a driven object, such as an arm, from dropping when the motor stops.

Among such brake drive and control devices, a brake drive and control device having a switching element connected to one end of the brake and a switching element connected to the other end of the brake is proposed in, for example, Japanese Patent No. 4734581 (JP4734581B). By using a brake drive and control device having two switching elements as described above, even in the event of a short circuit failure of one of the switching elements, it is possible to block the brake drive current flowing through the brake by bringing the other switching element into the off state. Consequently, even in the event of short circuit failure of one of the switching elements, the state of the brake can be changed from the disengaged state to the engaged state, and therefore, it is possible to prevent the driven object from dropping when the motor stops.

In the case where it is determined whether or not there is a short circuit failure of the switching element in the brake drive and control device having two switching elements as described above, an operation to turn on one of the switching elements as well as turning off the other switching element, and an operation to turn off one of the switching elements as well as turning on the other switching element are necessary. That is, it is necessary for the brake drive and control device having two switching elements as described above to carry out the operation to turn on and off the switching elements twice in order to detect whether or not there is a short circuit failure of the switching element, and therefore, there is a disadvantage that it requires more time to detect whether or not a short circuit of the switching element has occurred.

SUMMARY OF THE INVENTION

As an aspect, the present invention provides a brake drive and control device capable of reducing the time required to detect whether or not there is a short circuit failure of a switching element.

According to an aspect of the present invention, the brake drive and control device for driving and controlling a brake in order to change a state of the brake from a disengaged state into an engaged state by stopping a brake drive current flowing through the brake that brakes a driven object driven in a gravity axis direction by a motor, includes: a first switching element connected to one end of the brake and configured to switch from the off state to the on state when a switch command is input in order to cause a brake drive current to flow through the brake; a second switching element connected to the other end of the brake and configured to switch from the off state to the on state when a switch command is input in order to cause a brake drive current to flow through the brake; a voltage detection unit configured to detect a brake voltage being applied to the brake; a switch command delay unit configured to delay the switch command input to the first switching element; and a short circuit failure determination unit configured to determine whether or not a short circuit failure has occurred in the first switching element based on the brake voltage and the switch command delayed by the switch command delay unit.

Preferably, the switch command delay unit includes a comparator having an inversion input part to which a switch command is input, a non-inversion input part connected to a reference potential, and an output part, and a NOT gate having an input part connected to the output part of the comparator and an output part connected to the first switching element, and the short circuit failure determination unit has a logical product operation unit having a first input part connected to the output part of the comparator, a second input part to which a brake voltage is input from the voltage detection unit, and an output part configured to output a result of a logical product operation of an inverted level of the switch command output from the comparator and a level of the brake voltage.

According to an aspect of the present invention, it is possible to reduce the time required to detect whether or not a short circuit of a switching element has occurred.

BRIEF DESCRIPTION OF THE DRAWINGS

The objects, features, and advantages of the present invention will be clear based on the description in the following embodiments relating to the accompanying drawing. In the drawings.

DETAILED DESCRIPTION

Embodiments of the brake drive and control device according to the present invention are explained with reference to the drawings.

Figure 1:
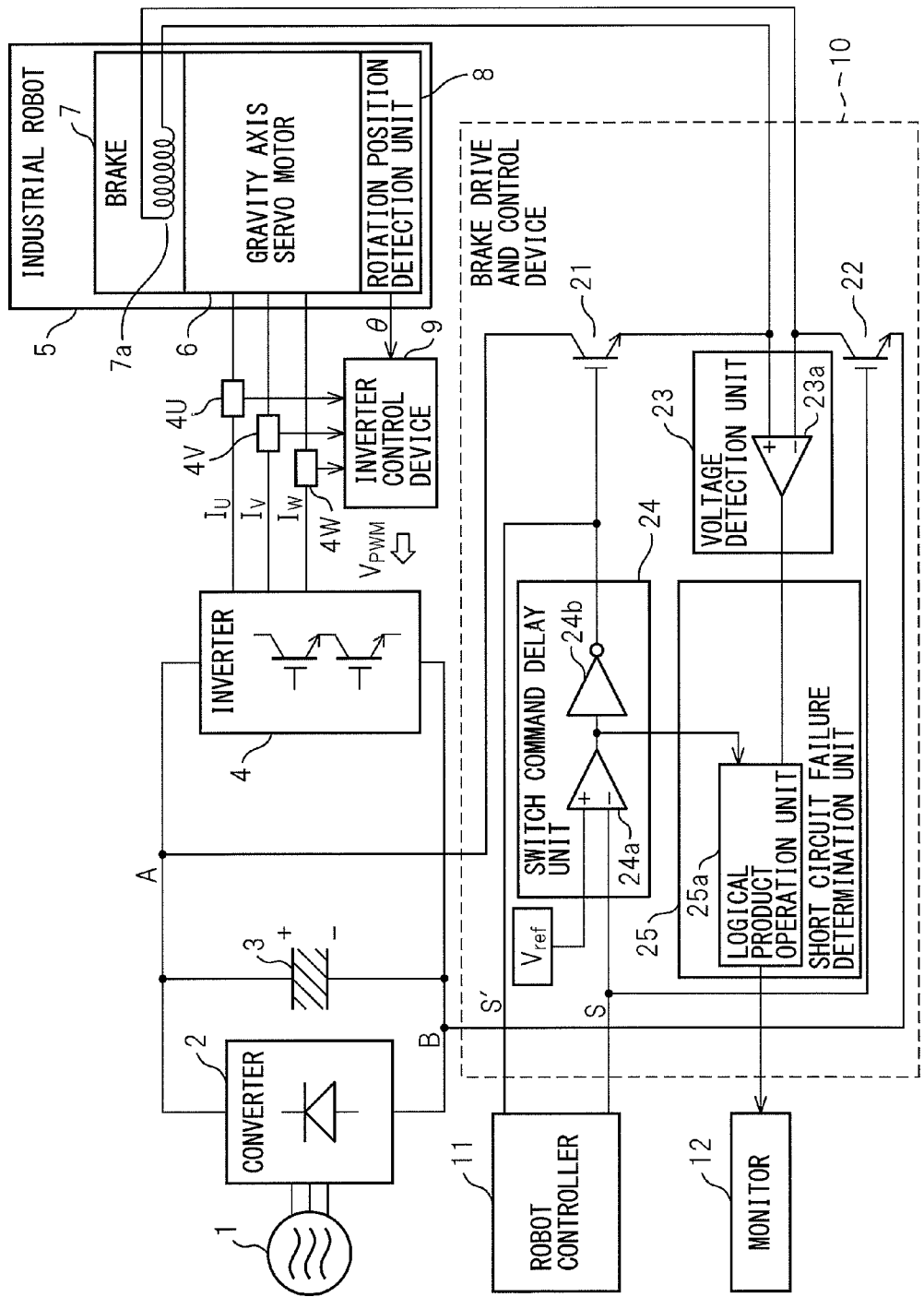
FIG. 1 is a block diagram of a system to which a brake drive and control device according to the present invention is applied.

Referring to the drawings, FIG. 1 is a block diagram of a system to which the brake drive and control device according to the present invention is applied. The system illustrated in FIG. 1 is used in an industrial robot and has a three-phase alternating-current power source 1 as an alternating-current power source, a converter 2, a smoothing capacitor 3 as a DC link part, an inverter 4, a gravity axis servo motor 6 included in an industrial robot 5, a brake 7, a rotation position detection unit 8, an inverter control device 9, a brake drive and control device 10, a robot controller 11, and a monitor 12.

The converter 2 consists of a plurality (six in the case of three-phase alternating current) of rectifier diodes, for example, and converts alternating-current power supplied from the three-phase alternating-current power source 1 into direct-current power. The smoothing capacitor 3 is connected in parallel to the converter 2 in order to smooth a voltage rectified by the rectifier diode of the converter 2. The inverter 4 is connected in parallel to the smoothing capacitor 3, consists of a plurality (six in the case of three-phase alternating current) of transistors, and converts the direct-current power into which converted by the converter 2 into alternating-current power by turning on and off the transistor based on a PWM signal $V_{PWM}$, explained later.

The industrial robot 5 has a plurality of arms, not illustrated schematically for clearness. The gravity axis servo motor 6 is driven by power accumulated in the smoothing capacitor 3 in order to drive one of the plurality of arms of the industrial robot 5 in the gravity axis direction (Z-axis direction).

The state of the brake 7 is changed from the engaged state into the disengaged state by causing a brake drive current to flow through the brake 7 in order to drive a corresponding arm in the gravity axis direction when the gravity axis servo motor 6 is driven. Further, the state of the brake 7 is changed from the disengaged state into the engaged state by stopping the brake drive current flowing through the brake 7 in order to prevent the corresponding arm from dropping by braking the corresponding arm when the gravity axis servo motor 6 is stopped. To do this, the brake 7 has a brake coil 7a through which a brake drive current is caused to flow.

The rotation position detection unit 8 consists of a rotary encoder configured to detect a rotation angle θ of the gravity axis servo motor 6 as a position or speed of the motor.

In order to control the inverter 4, the inverter control device 9 samples current values of three phases of a U-phase current $I_U$, a V-phase current $I_V$, and a W-phase current $I_W$ detected by current detection units 4u, 4v, and 4w provided in the output lines of the inverter 4 as current value data of the gravity axis servo motor 6, and samples the rotation angle θ as the position or speed data of the motor, respectively.

Then, the inverter control device 9 generates the PWM signal $P_{PWM}$ to drive the gravity axis servo motor 7 based on the current value data and the position or speed data of the motor that are sampled, and position or speed command data of the motor from an upper control device, not illustrated schematically for clearness.

The current detection units 4u, 4v, and 4w consist of Hall elements, respectively, for example, and the upper control device, not illustrated schematically, consists of a CNC (computer numerical control), for example.

The brake drive and control device 10 drives and controls the brake 7 in order to change the state of the brake 7 from the engaged state to the disengaged state by causing a brake drive current to flow through the brake coil 7a, or to change the state of the brake 7 from the disengaged state to the engaged state by stopping the brake drive current flowing through the brake coil 7a. To do this, the brake drive and control device 10 has an NPN-type transistor 21 as a first switching element, an NPN-type transistor 22 as a second switching element, a voltage detection unit 23, a switch command delay unit 24, and a short circuit failure determination unit 25.

The NPN-type transistor 21 has a base to which a switch command S for making a brake drive current flow through the brake coil 7a is input from the robot controller 11 via the switch command delay unit 24, a collector connected to a connection point A at a first potential (in this case, a power source voltage), and an emitter connected to one end of the brake coil 7a. Consequently, the NPN-type transistor 21 switches from the off state to the on state when the switch command S is input to the base of the NPN-type transistor 21. Further, to the base of the NPN-type transistor 21, a switch command S' to determine whether or not a short circuit has occurred in the NPN-type transistor 21 is input from the robot controller 11 directly, i.e., without being interposed by the switch command delay unit 24. Consequently, the NPN-type transistor 21 switches from the off state to the on state when the switch command S' is input to the base of the NPN-type transistor 21.

The NPN-type transistor 22 has a base to which the switch command S for making a brake drive current flow through the brake coil 7a is input directly, a collector connected to the other end of the brake coil 7a, and an emitter connected to a connection point B at a second potential (in this case, 0 V). Consequently, the NPN-type transistor 22 switches from the off state to the on state when the switch command S is input to the base of the NPN-type transistor 22.

The voltage detection unit 23 detects a brake voltage being applied to the brake coil 7a. To do this, the voltage detection unit 23 has a non-inversion input part connected to one end of the brake coil 7a, an inversion input part connected to the other end of the brake coil 7a, and an output part connected to the short circuit failure determination unit 25.

The switch command delay unit 24 delays the switch command S, which is input to the NPN-type transistor 21, by a time T. To do this, the switch command delay unit 24 has a comparator 24a including an RC circuit, and a NOT gate 24b. The comparator 24a has an inversion input part to which the switch command S is input, a non-inversion input part connected to a reference potential, and an output part connected to the input part of the NOT gate 24b and the short circuit failure determination unit 25. The NOT gate 24b has an input part connected to the output part of the comparator 24a and an output part connected to the base of the NPN-type transistor 21.

The short circuit failure determination unit 25 determines whether or not a short circuit has occurred in the NPN-type transistor 21, based on the level of the brake voltage corresponding to the potential of the output part of an operational amplifier 23a and the level of the switch command S delayed by the switch command delay unit 24. To do this, the short circuit determination unit 25 has a logical product operation unit 25a. The logical product operation unit 25a has a first input part connected to the output part of the comparator 24a, a second input part to which a brake voltage is input from the operational amplifier 23a, and an output part configured to output a result (level of a potential) of a logical product operation of an inverted level of the switch command S output from the output part of the comparator 24a and a level of the brake voltage.

To the monitor 12, the result of the logical product operation is input from the logical product operation unit 25a, and the monitor 12 displays the result of the logical product operation (the level of the potential of the output part of the logical product operation unit 25a) so that it is possible to determine whether or not a short circuit has occurred in the NPN-type transistor 21.

Figure 2:
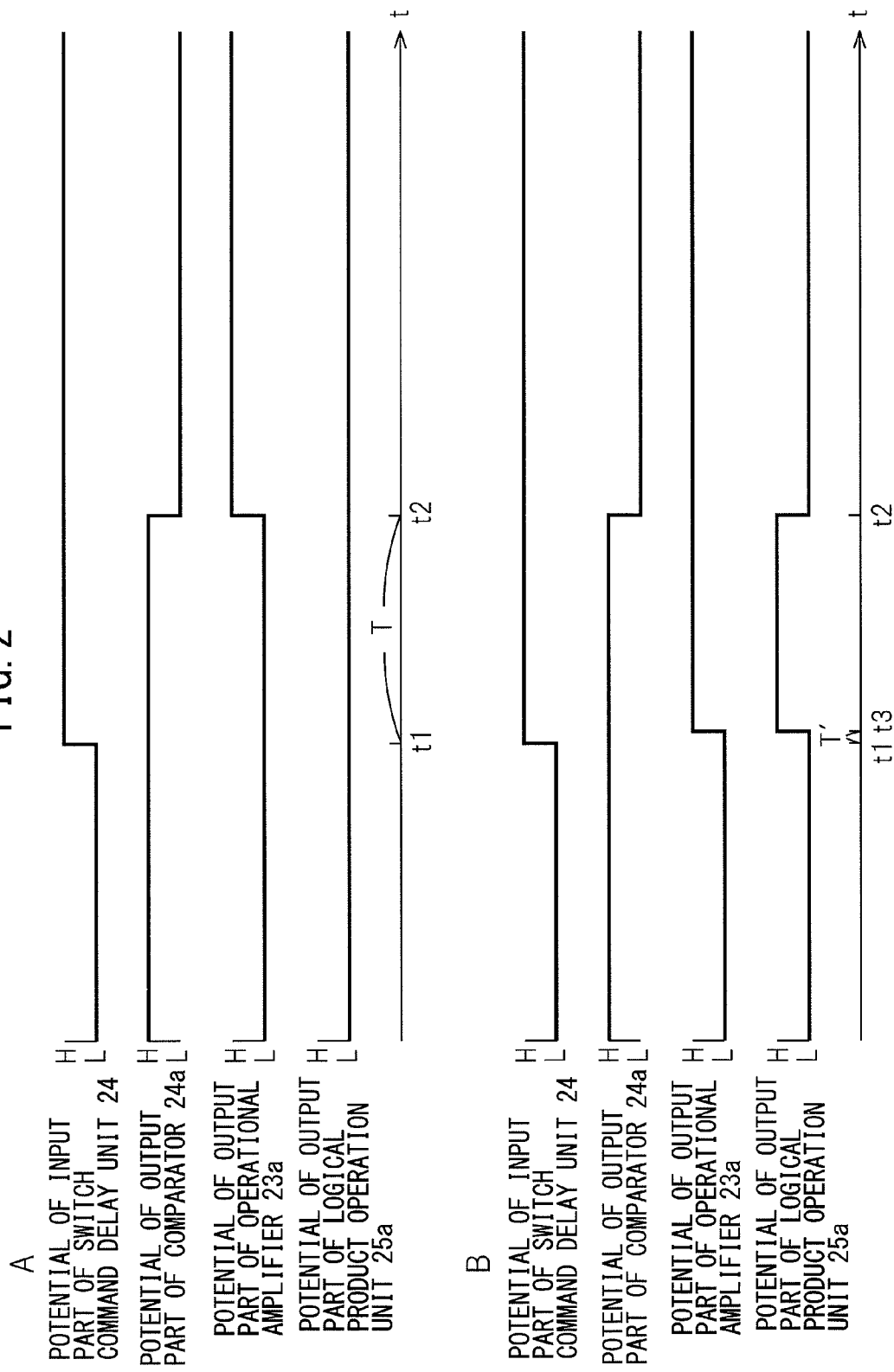
FIG. 2A is a diagram for explaining an operation when there is no short circuit failure in one of the transistors of the brake drive and control device illustrated in FIG. 1.
FIG. 2B is a diagram for explaining an operation when there is a short circuit failure in one of the transistors of the brake drive and control device illustrated in FIG. 1.

FIG. 2A is a diagram for explaining the operation when there is no short circuit failure in the NPN-type transistor 21 of the brake drive and control device 10 shown in FIG. 1. In the case where a short circuit failure has not occurred in the NPN-type transistor 21, if the robot controller 11 outputs the switch command S at a time t1, the potential of the input part of the switch command delay unit 24 switches from the low (L) level to the high (H) level at the time t1, the potential of the output part of the comparator 24a switches from the high level to the low level at a time t2 when the time T elapses from the time t1, and the potential of the operational amplifier 23a switches from the low level to the high level at the time t2. Before the time t2, the potential of the comparator 24a and the potential of the operational amplifier 23a are at the high level and at the low level, respectively, and the potential of the comparator 24a switches from the high level to the low level at the time t2 and at the same time, the potential of the operational amplifier 23a switches from the low level to the high level, and after the time t2, the potential of the comparator 24a and the potential of the operational amplifier 23a are at the low level and at the high level, respectively. Consequently, the potential of the output part of the logical product operation unit 25a is at the low level at all times. In the case where the potential of the output part of the logical product operation unit 25a, which is at the low level at all times, is displayed on the monitor 12 when the robot controller 11 outputs the switch command S, it is known that a short circuit has not occurred in the NPN-type transistor 21.

FIG. 2B is a diagram for explaining the operation when there is a short circuit failure in the NPN-type transistor 21 of the brake drive and control device 10 shown in FIG. 1. In the case where a short circuit failure has occurred in the NPN-type transistor 21, if the robot controller 11 outputs the switch command S at the time t1, the potential of the input part of the switch command delay unit 24 switches from the low level to the high level at the time t1, and the potential of the output part of the comparator 24a switches from the high level to the low level at the time t2. In the case where a short circuit has occurred in the NPN-type transistor 21, at a time t3 when a time T' elapses after the robot controller 11 outputs the switch command S, the potential of the operational amplifier 23a switches from the low level to the high level at the time t3 because a current flows through the motor coil 7a when the NPN-type transistor 22 enters the on state. Before the time t3, the potential of the comparator 24a and the potential of the operational amplifier 23a are at the high level and at the low level, respectively, the potential of the operational amplifier 23a switches from the low level to the high level at the time t3, and the level of the comparator 24a switches from the high level to the low level at the time t2, and after the time t2, the potential of the comparator 24a and the potential of the operational amplifier 23a are at the low level and at the high level, respectively. Consequently, before the time t3 and after the time t2, the potential of the output part of the logical product operation unit 25a is at the low level. On the other hand, between the time t3 and the time t2, the potential of the output part of the logical product operation unit 25a is at the high level. In the case where the potential of the output part of the logical product operation unit 25a, which is at the high level between the time t3 and the time t2, is displayed on the monitor 12 when the robot controller 11 outputs the switch command S, it is known that a short circuit has occurred in the NPN-type transistor 21.

Figure 3:
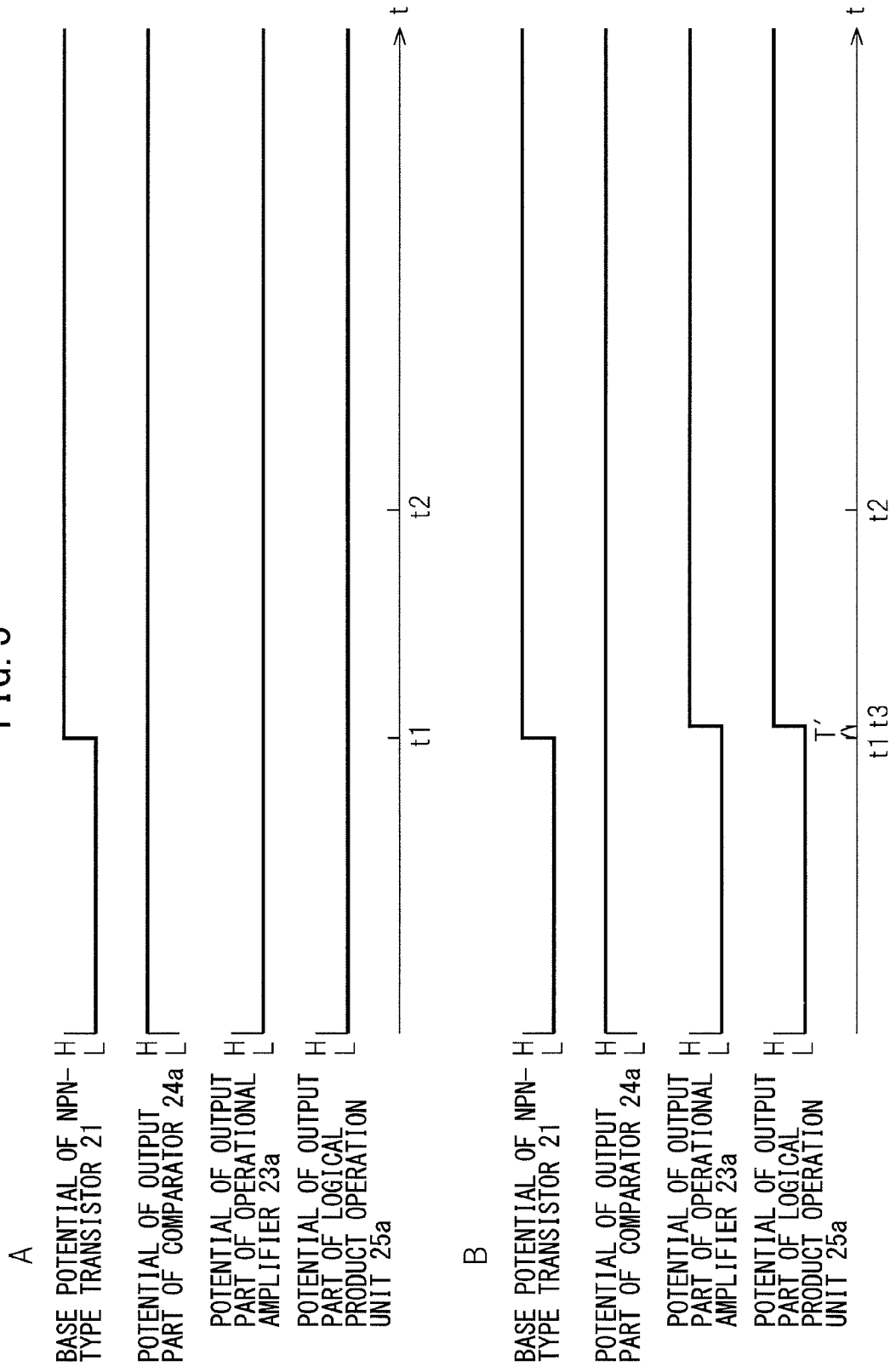
FIG. 3A is a diagram for explaining an operation when there is no short circuit failure in the other transistor of the brake drive and control device illustrated in FIG. 1.
FIG. 3B is a diagram for explaining an operation when there is a short circuit failure in the other transistor of the brake drive and control device illustrated in FIG. 1.

FIG. 3A is a diagram for explaining the operation when there is no short circuit in the NPN-type transistor 22 of the brake drive and control device 10. In the case where a short circuit failure has not occurred in the NPN-type transistor 22, if the robot controller 11 outputs the switch command S' at the time t1, the potential of the input part of the switch command delay unit 24 switches from the low level to the high level at the time t1. In the case where a short circuit has not occurred in the NPN-type transistor 22, the NPN-type transistor 22 remains in the off state even if the NPN-type transistor 21 enters the on state, and therefore, no current flows through the motor coil 7a. Consequently, the potential of the output part of the comparator 24a is at the high level at all times, the potential of the operational amplifier 23a is at the low level at all times, and the potential of the output part of the logical product operation unit 25a remains at the low level. In the case where the potential of the output part of the logical product operation unit 25a, which is at the low level at all times, is displayed on the monitor 12 when the robot controller 11 outputs the switch command S', it is known that a short circuit failure has not occurred in the NPN-type transistor 22.

FIG. 3B is a diagram for explaining the operation when there is a short circuit failure in the NPN-type transistor 22 of the brake drive and control device 10. In the case where a short circuit failure has occurred in the NPN-type transistor 22, if the robot controller 11 outputs the switch command S' at the time t1, the potential of the input part of the switch command delay unit 24 switches from the low level to the high level at the time t1 and the potential of the output part of the comparator 24a is at the high level at all times. In the case where a short circuit failure has occurred in the NPN-type transistor 22, at the time t3 when the time T' elapses after the robot controller 11 outputs the switch S', the potential of the operational amplifier 23a switches from the low level to the high level at the time t3 because a current flows through the motor coil 7a when the NPN-type transistor 21 enters the on state. Before the time t3, the potential of the comparator 24a and the potential of the operational amplifier 23a are at the high level and at the low level, respectively, and the potential of the operational amplifier 23a switches from the low level to the high level at the time t3. Consequently, after the time t3, the potential of the output part of the logical product operation unit 25a is at the high level. In the case where the potential of the output part of the logical product operation unit 25a, which is at the high level after the time t3, is displayed on the monitor 12 when the robot controller 11 outputs the switch command S', it is known that a short circuit has occurred in the NPN-type transistor 22.

According to the present embodiment, it is possible to detect whether or not a short circuit of the NPN-type transistor 21 has occurred when causing a brake drive current to flow through the motor coil 7a, and therefore, it is no longer necessary to turn on and off the NPN-type transistor 21 in order to detect whether or not a short circuit of the NPN-type transistor 21 has occurred. Consequently, it is possible to reduce the time required to detect whether or not there is a short circuit failure of the NPN-type transistors 21 and 22.

The present invention is not limited to the above-mentioned embodiments and there can be a number of alterations and modifications. For example, it is possible to apply the brake drive and control device according to the present invention to a system which uses a gravity axis servo motor, etc., in a machine tool, etc.

Further, in the embodiments, as an alternating-current power source, the three-phase alternating-current power source 1 is used, however, it is also possible to use a multi-phase alternating-current power source other than the three-phase alternating-current power source as an alternating-current power source. Further, it is possible to configure the rotation position detection unit 8 by a component (for example, Hall element or resolver) other than the rotary encoder. Further, it may also be possible to detect only the two phases of the currents (for example, the U-phase current and the V-phase current) of the U-phase current, the V-phase current, and the W-phase current instead of detecting all the U-phase current, the V-phase current, and the W-phase current.

In the embodiments, the case where the NPN-type transistor is used as the first switching element and the second switching element is explained, however, it is possible to use a PNP-type transistor, a field effect transistor (FET), an insulated-gate bipolar transistor (IGBT), a relay, etc., as the first switching element and the second switching element.

In the embodiments, the case where the voltage detection unit 23 has the operational amplifier 23a is explained, however, it is also possible to configure the voltage detection unit 23 by a photocoupler, etc. Further, in the embodiments, the case where the switch command delay unit 24 has one comparator 24a and one NOT gate 24b is explained, however, the switch command delay unit 24 may have an odd number (three or more) of comparators and one NOT gate.

Furthermore, the case where the switch command S, which is input to the base of the NPN-type transistor 21, is delayed is explained, however, it is also possible to delay the switch command S, which is input to the base of the NPN-type transistor 22. In this case, the NPN-type transistor 22 corresponds to the first switching element and the NPN-type transistor 21 corresponds to the second switching element.

As above, the present invention is explained in relation to the preferred embodiments thereof, however, persons skilled in the art should understand that there can be a variety of alterations and modifications without deviating from the scope of claims, as described later.

The invention claimed is:

1. A brake drive and control device for driving and controlling a brake in order to change a state of the brake from a disengaged state into an engaged state by stopping a brake drive current flowing through the brake that brakes a driven object driven in a gravity axis direction by a motor, comprising:
   a first switching element connected to one end of the brake and configured to switch from the off state to the on state when a switch command is input to cause a brake drive current to flow through the brake;
   a second switching element connected to the other end of the brake and configured to switch from the off state to the on state when the switch command is input to cause a brake drive current to flow through the brake;
   a voltage detection unit configured to detect a brake voltage being applied to the brake;
   a switch command delay unit configured to delay the switch command input to the first switching element; and
   a short circuit failure determination unit configured to determine whether or not a short circuit failure has occurred in the first switching element based on the brake voltage and the switch command delayed by the switch command delay unit.

2. The brake drive and control device according to claim 1, wherein
   the switch command delay unit includes a comparator having an inversion input part to which the switch command is input, a non-inversion input part connected to a reference potential, and an output part, and a NOT gate having an input part connected to the output part of the comparator and an output part connected to the first switching element, and
   the short circuit failure determination unit includes a logical product operation unit having a first input part connected to the output part of the comparator, a second input part to which the brake voltage is input from the voltage detection unit, and an output part configured to output a result of a logical product operation of an inverted level of the switch command output from the comparator and a level of the brake voltage.

* * * * *